United States Patent [19]
Haglund

[11] 4,119,904
[45] Oct. 10, 1978

[54] LOW BATTERY VOLTAGE DETECTOR
[75] Inventor: Stephen A. Haglund, Minnetonka, Minn.
[73] Assignee: Honeywell Inc., Minneapolis, Minn.
[21] Appl. No.: 786,522
[22] Filed: Apr. 11, 1977
[51] Int. Cl.² .......................... H02J 7/00; H03K 3/26
[52] U.S. Cl. ...................................... 320/48; 307/279; 307/304; 340/636
[58] Field of Search .................... 320/39, 40, 48, 13; 340/249; 307/279, 304, 200 B; 324/29.5; 58/23 BA; 328/48

[56] References Cited
U.S. PATENT DOCUMENTS

| | | | |
|---|---|---|---|
| 3,594,751 | 7/1971 | Ogden et al. | 340/509 |
| 3,778,800 | 12/1973 | Blackwell et al. | 340/512 |
| 3,899,732 | 8/1975 | Staby | 324/29 |
| 3,934,145 | 1/1976 | Dobrzanski | 250/281 |
| 3,935,531 | 1/1976 | Slomcenski | 320/48 X |
| 4,013,902 | 3/1977 | Payne | 328/48 X |
| 4,041,691 | 8/1977 | Chihara et al. | 58/23 BA |
| 4,045,688 | 8/1977 | Stewart | 307/200 B |

OTHER PUBLICATIONS

"Gas and Smoke Detector", Pshaenich et al., Electronics, Nov. 28, 1974, pp. 124, 125.
"CD4007A/ . . . Types", C0S/MOS Dig. Int.Ckts. RCA Databook, pp. 30-33.

Primary Examiner—Robert J. Hickey
Attorney, Agent, or Firm—Clyde C. Blinn; Henry L. Hanson

[57] ABSTRACT

A circuit is provided for detecting a low battery voltage for use with applications where it is desirable to keep the drain on the battery at a very low value and to do so at a minimum cost.

10 Claims, 1 Drawing Figure

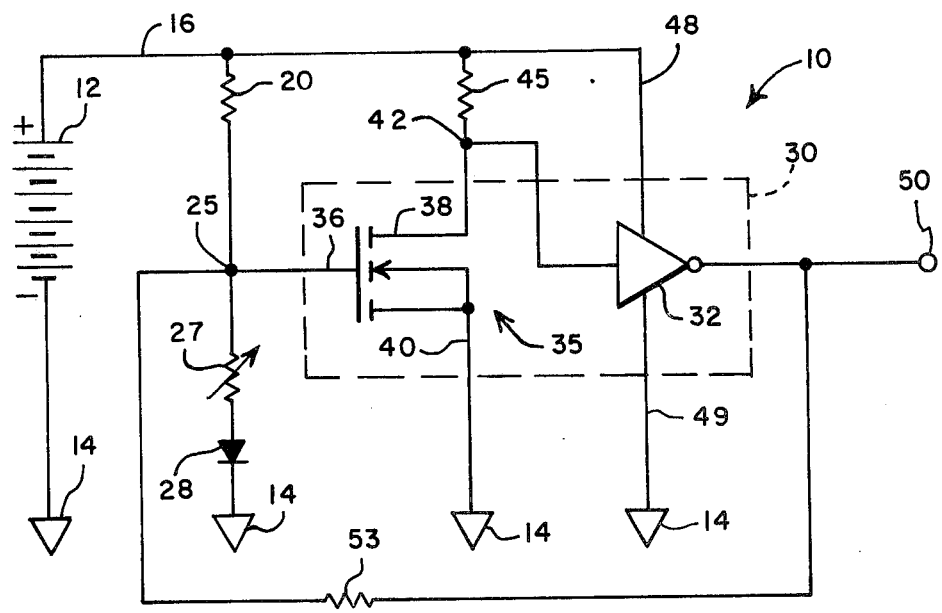

111
LOW BATTERY VOLTAGE DETECTOR

SUMMARY OF THE INVENTION

The present invention relates generally to apparatus for producing a signal when the voltage of a battery has reached some predetermined output value indicative that the battery is beginning to fail and, more specifically, to a circuit which will provide such signal using as little current drain from the battery as possible while at the same time minimizing the cost of the components involved. A C/MOS integrated circuit which may be of the type identified as the RCA CD4007A, a low cost item, is employed and is connected so as to provide an N channel MOSFET and an inverter. The gate of the MOSFET is connected to a very high resistance voltage divider that is connected across the battery, the source is connected to ground and the drain is connected to the input of the inverter and, through a resistor, to the battery. As the battery voltage begins to fail, the voltage on the gate of the MOSFET approaches the threshold value thereof, at which point the MOSFET begins to turn off and the voltage to the input of the inverter begins to rise. With a rise in voltage at the input of the inverter, a decreased voltage at the output of the inverter results. The output of the inverter is connected through a feedback resistor to the gate of the MOSFET so that as the output of the inverter begins to fall, the input on the gate of the MOSFET falls even further with the result that the whole apparatus switches off with a snap type action.

DESCRIPTION OF THE PRIOR ART

Circuits for detecting a low battery condition and for producing a warning signal in accordance therewith are well known in the art. Circuits such as are shown in U.S. Pat. No. 3,594,751, issued to Wilbur L. Ogden and Clarence G. Henderson on July 20, 1971, and U.S. Pat. No. 3,934,145, issued to John Dobrzranski and Ernest V. Hart on Jan. 20, 1976, use a zener diode in series with a resistor across the battery in question and with the junction therebetween connected to a programmable unijunction trsnsistor. The difficulty with this type of circuit is in the use of a zener diode which although operable to detect low voltage is very expensive if a good zener operable with low current levels is used. The present invention operates on very low circuit levels not obtainable with even good zener diodes and without the zener diode cost. U.S. Pat. No. 3,899,732 issued to Paul A. Staby on Aug. 12, 1975, shows a unijunction transistor connected across a fairly complicated bridge type circuit involving the use of diodes and resistors arranged across the battery source in question and an oscillator circuit which periodically loads the battery so that the bridge circuit periodically pulses when the battery is too low. The difficulty with this circuit is in its complexity and from the fact that when the battery is loaded, it is drawing relatively high currents in an undesirable fashion. The present invention is extremely simple and uses very low currents in operation. U.S. Pat. No. 3,778,800 issued to Lyman L. Blackwell on Dec. 11, 1973, utilizes a voltage divider connected across the battery in question as a source of potential for the base of a transistor. As the voltage at the juncture of the voltage divider decreases due to the battery's beginning to fail, the transistor tends to turn off to produce an alarm. This circuit, again, requires relatively high current levels and could not be used in applications requiring a drain of 2 to 3 microamps which the present invention accomplishes.

BRIEF DESCRIPTION OF THE DRAWINGS

The FIGURE shows a schematic diagram of the preferred embodiment of the present invention.

DETAILED DESCRIPTION OF THE PREFERRED EMBODIMENT

In the FIGURE, reference numeral 10 refers to a circuit for detecting a low level of voltage produced by a battery 12 which may be a 9-volt battery utilized in connection with apparatus such as a smoke detector and wherein it is desired to produce a signal or alarm when the battery begins to wear out. Battery 12 is connected between the source of reference potential 14 and a conductor 16. A voltage divider network consisting of a resistor 20 whose value may be in the neighborhood of 6 or 7 megohms has one end connected to the conductor 16 and the other end connected to a junction point 25. A variable resistor 27 whose value may be around a million ohms has one end connected to junction point 25 and the other end connected to the anode of a diode 28. The cathode of diode 28 is shown connected to the source of reference potential 14. Diode 28 is placed in the circuit for purposes of temperature correction since its resistance change with temperature will approximate the changes which occur in the MOSFET. The voltage divider formed by resistors 20 and 27 produces a voltage at point 25 which will vary with the variations of the voltage from battery 12 and slightly with temperature changes due to diode 28. The level of voltage at point 25 can be adjusted by varying the wiper arm of variable resistor 27 so as to set the desired voltage for which an alarm is to be produced proximate the threshold of the MOSFET.

There is shown in the FIGURE a dashed line rectangular box identified by reference numeral 30 and which comprises a C/MOS integrated circuit such as the RCA CD4007A connected so as to produce an inverter 32 and an N channel MOSFET 35 having a gate terminal 36, a drain terminal 38 and a source terminal 40. The source terminal 40 is connected exteriorly to the C/MOS integrated circuit to the reference potential 14. Gate terminal 36 is shown connected to the junction point 25 and drain terminal 38 is shown connected exteriorly of the C/MOS to the input terminal of the inverter 32 at a junction point 42. A bias resistor 45 which may be about 12 megohms is connected between point 42 and conductor 16. Also shown is a conductor 48 connecting conductor 16 to the inverter 32 and this connection operates to supply bias to the inverter. Inverter 32 is also shown connected to the reference potential 14 by a conductor 49. The output of inverter 32 is connected exteriorly of the C/MOS integrated circuit to a point 50 which in turn is connected by a resistor 53 which may be between six and seven megohms to the junction point 25 to supply feedback for the circuit.

In operation, resistor 27 is adjusted until the voltage at point 25 is at a predetermined value above the threshold point of the N channel MOSFET 35. So long as the voltage at point 25 stays above the predetermined value, the MOSFET is gated on so that a relatively low voltage appears at junction point 42 as the input to inverter 32. The inverter operates on this to produce a relatively high output voltage at point 50 which is fed back through resistor 53 to the junction point 25 to maintain the N channel MOSFET in an on condition.

However, when the battery 12's voltage drops to a point indicative of incipient battery failure, the voltage at point 25 falls below the threshold value of MOSFET 35, the MOSFET begins to turn off and the voltage at point 42 rises. As the voltage at point 42 rises, the output voltage from inverter 32 will decrease and when this voltage is fed back through resistor 53 to the junction point 25, the voltage on gate terminal 36 decreases yet further. This further decrease still further increases the voltage at point 42 and it is seen that after the threshold voltage at point 25 has been reached, the circuit shown tends to shut off rapidly in a "snap action" fashion. When MOSFET 35 is off, the low signal appearing at point 50 is used by other circuitry (not shown) to provide an alarm or other indication that the battery's voltage has deteriorated to a point where it should be replaced.

It is seen that the relatively high resistance value of resistors 20 and 45 put a current drain across battery 12 of only about two or three microamps and thus do not significantly lower the voltage source. Since C/MOS circuits and resistors are relatively inexpensive, it is seen that I have provided a circuit which can be manufactured at low cost and which does not drain significant current from a battery but nevertheless will produce reliable indication of when the battery needs replacement. Many obvious modifications will occur to those skilled in the art and I do not wish to be limited by the specific disclosures used in connection with the preferred embodiment described herein. I intend only to be limited by the following claims:

I claim:

1. Apparatus for detecting a low voltage condition in a battery comprising:
    a MOSFET having a gate, a source and a drain;
    an inverter having an input and an output;
    first means for connecting the gate of the MOSFET to one terminal of the battery;
    second means for connecting the source of the MOSFET to the other terminal of the battery;
    third means for connecting the drain of the MOSFET to the one terminal of the battery and to the input of the inverter; and
    feedback means for connecting the output of the inverter to the gate of the MOSFET; a predetermined low voltage condition in the battery causing a decrease in voltage at the gate of the MOSFET, when this voltage becomes below the threshold voltage of the MOSFET, the MOSFET starts to turn off thus producing an increased voltage at the input of the inverter and a decreased voltage at the output of the inverter which is fed back to further decrease the voltage and cause rapid shut off of the MOSFET and producing an indication of the low voltage condition in the battery.

2. Apparatus according to claim 1 wherein the first means includes a voltage divider for connection across the battery.

3. Apparatus according to claim 2 wherein the voltage divider includes a first resistor of magnitude in excess of one megohm and a variable resistor connected to the first resistor with the gate of the MOSFET connected to the connection between the first resistor and the variable resistor, the variable resistor being varied to establish the desired battery voltage level to produce a voltage equal to the threshold voltage on the gate of the MOSFET when the battery begins to fail.

4. Apparatus according to claim 3 wherein the voltage divider further includes a temperature compensating element whose resistance changes with temperature to vary the voltage at the gate of the MOSFET.

5. Apparatus according to claim 4 wherein the temperature compensating element is a diode.

6. Apparatus according to claim 2 wherein the third means includes a resistor having a first terminal connected to the drain and a second terminal for connection to the battery and the input of the inverter being connected to the first terminal of the resistor.

7. Apparatus according to claim 6 wherein the feedback means includes a resistor.

8. Apparatus according to claim 1 wherein the MOSFET and the inverter are formed from elements of a C/MOS integrated circuit.

9. Apparatus for use with a battery having a positive terminal and a negative terminal comprising:
    a first resistor having a first terminal for connection to the positive terminal of the battery and having a second terminal;
    a variable resistor having a first terminal connected to the second terminal of the first resistor and having a second terminal;
    means for connecting the second terminal of the variable resistor to the negative terminal of the battery;
    an N channel MOSFET having a gate terminal, a source terminal and a drain terminal;
    means connecting the gate terminal of said N channel MOSFET to the second terminal of the first resistor;
    means for connecting the source terminal of said N channel MOSFET to the negative terminal of the battery;
    a third resistor having a first terminal for connection to the positive terminal of the battery and a second terminal connected to the drain of said N channel MOSFET;
    an inverter having an input terminal and an output terminal;
    means connecting the input terminal of said inverter to the second terminal of said third resistor;
    a fourth resistor having a first terminal and a second terminal;
    means connecting the first terminal of said fourth resistor to the output terminal of said inverter; and
    means connecting the second terminal of said fourth resistor to the gate terminal of said N channel MOSFET.

10. Apparatus according to claim 9 wherein said N channel MOSFET and said inverter are formed from elements of a C/MOS integrated circuit.

* * * * *